(12) United States Patent
Koller et al.

(10) Patent No.: US 11,145,577 B2
(45) Date of Patent: Oct. 12, 2021

(54) LEAD FRAME WITH ANGULAR DEFLECTIONS AND WRAPPED PRINTED WIRING BOARDS FOR SYSTEM-IN-PACKAGE APPARATUS

(71) Applicant: Intel IP Corporation, Santa Clara, CA (US)

(72) Inventors: Sonja Koller, Regensburg (DE); Georg Seidemann, Landshut (DE); Reinhard Mahnkopf, Oberhaching (DE); Bernd Waidhas, Pettendorf, (DE)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/349,359

(22) PCT Filed: Dec. 29, 2016

(86) PCT No.: PCT/US2016/069147
§ 371 (c)(1),
(2) Date: May 13, 2019

(87) PCT Pub. No.: WO2018/125125
PCT Pub. Date: Jul. 5, 2018

(65) Prior Publication Data
US 2019/0267312 A1 Aug. 29, 2019

(51) Int. Cl.
*H01L 23/495* (2006.01)
*H01L 23/367* (2006.01)
(Continued)

(52) U.S. Cl.
CPC ........ *H01L 23/49568* (2013.01); *H01L 23/00* (2013.01); *H01L 23/367* (2013.01);
(Continued)

(58) Field of Classification Search
CPC ... H01L 23/00; H01L 23/367; H01L 23/3675; H01L 23/3736; H01L 23/49551;
(Continued)

(56) References Cited

U.S. PATENT DOCUMENTS

2003/0143871 A1* 7/2003 Sanada ................ H05K 5/0069
439/67
2004/0262737 A1 12/2004 Haba
(Continued)

FOREIGN PATENT DOCUMENTS

KR 1020060063963 A 6/2006
WO WO-2018125125 A1 7/2018

OTHER PUBLICATIONS

"International Application Serial No. PCT/US2016/069147, International Search Report dated Sep. 28, 2017", 3 pgs.
(Continued)

*Primary Examiner* — Jami Valentine Miller
*Assistant Examiner* — Dilinh P Nguyen
(74) *Attorney, Agent, or Firm* — Schwegman Lundberg & Woessner, P.A.

(57) ABSTRACT

A system-in-package apparatus includes a square wave lead frame that provides a recess for a first semiconductive device as well as a feature for a second device. The system-in-package apparatus includes a printed wiling board that is wrapped onto the lead frame after a manner to enclose the first semiconductive device into the recess.

20 Claims, 8 Drawing Sheets

(51) Int. Cl.
*H01L 23/373* (2006.01)
*H01L 23/498* (2006.01)
*H01L 23/538* (2006.01)
*H01L 23/00* (2006.01)

(52) U.S. Cl.
CPC ...... *H01L 23/3675* (2013.01); *H01L 23/3736* (2013.01); *H01L 23/49551* (2013.01); *H01L 23/49575* (2013.01); *H01L 23/49838* (2013.01); *H01L 23/49861* (2013.01); *H01L 23/5386* (2013.01); *H01L 23/5387* (2013.01); *H01L 2224/16225* (2013.01); *H01L 2224/73253* (2013.01)

(58) Field of Classification Search
CPC ......... H01L 23/49575; H01L 23/49838; H01L 23/49861; H01L 23/5386; H01L 23/5387
USPC ........................................................ 257/675
See application file for complete search history.

(56) References Cited

U.S. PATENT DOCUMENTS

| | | |
|---|---|---|
| 2006/0292756 A1 | 12/2006 | Primavera et al. |
| 2011/0042812 A1* | 2/2011 | Kayukawa ............ H01L 24/73 257/741 |
| 2013/0005055 A1 | 1/2013 | Lin et al. |
| 2014/0264821 A1 | 9/2014 | Tang et al. |

OTHER PUBLICATIONS

"International Application Serial No. PCT/US2016/069147, Written Opinion dated Sep. 28, 2017", 6 pgs.

"International Application Serial No. PCT US2016 069147, International Preliminary Report on Patentability dated Jul. 11, 2019", 8 pgs.

* cited by examiner

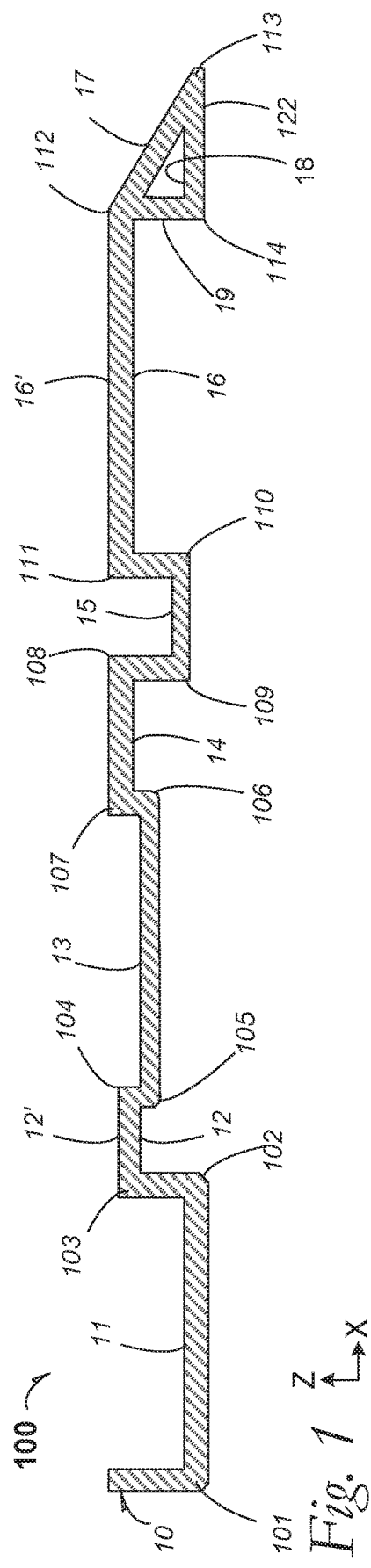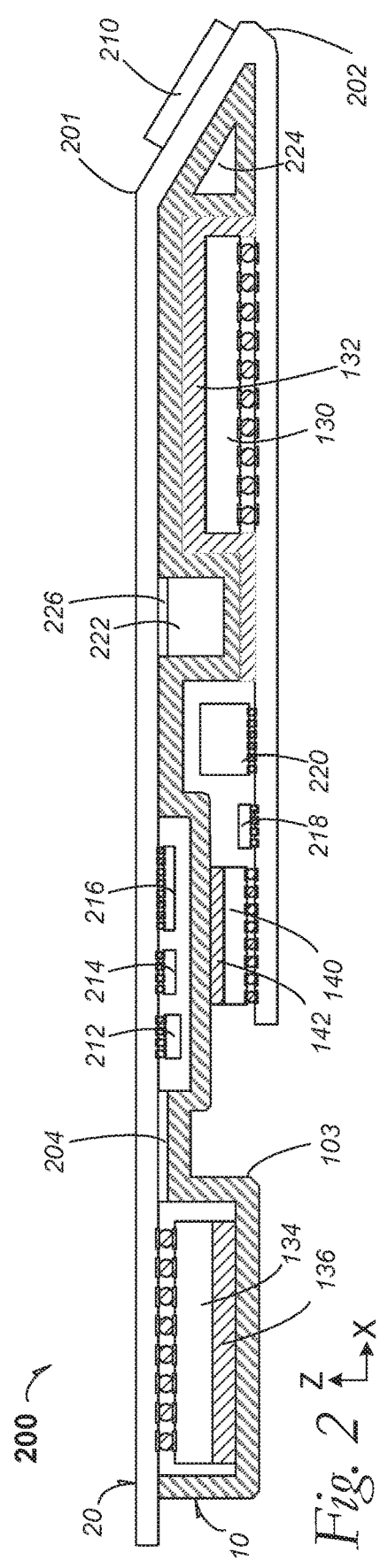

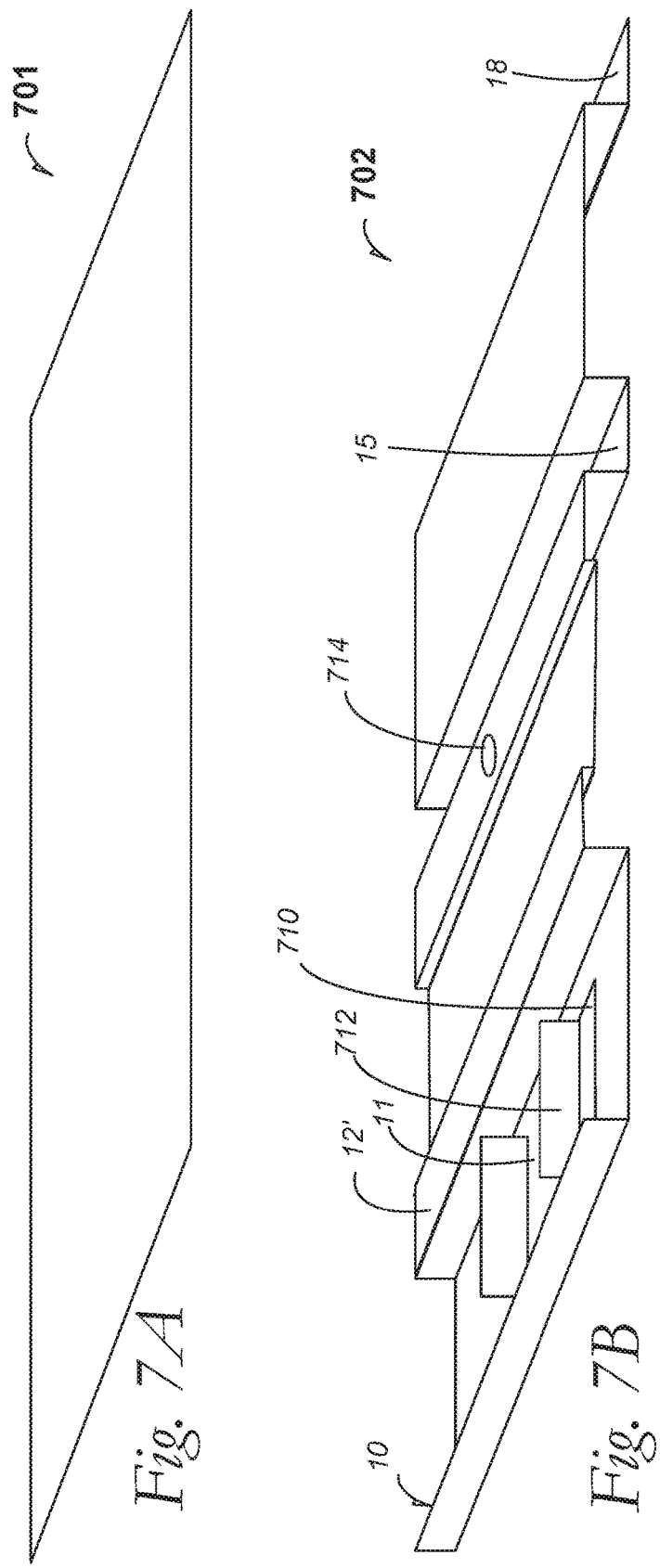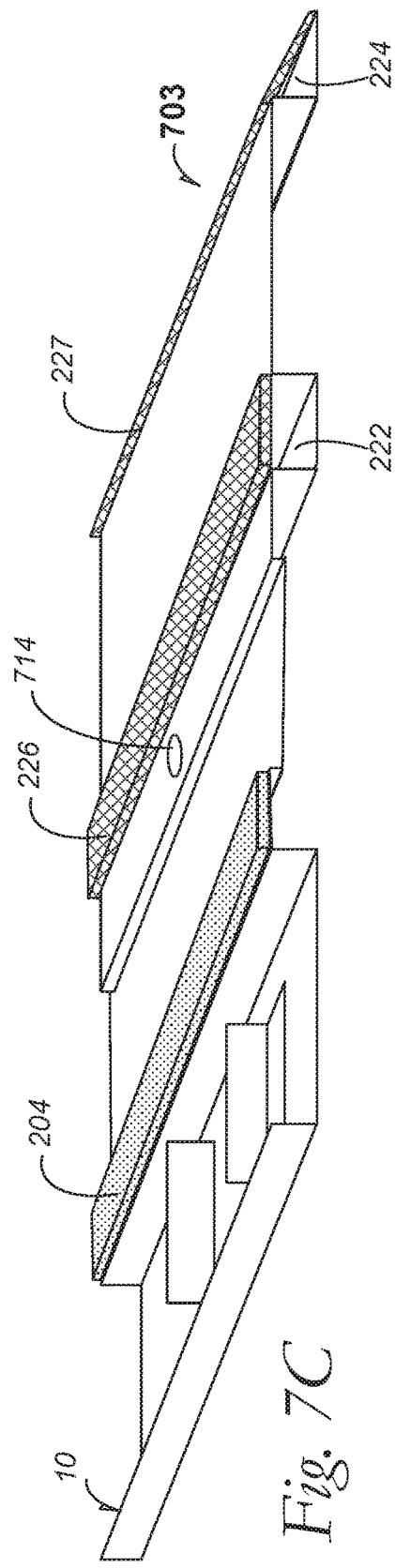

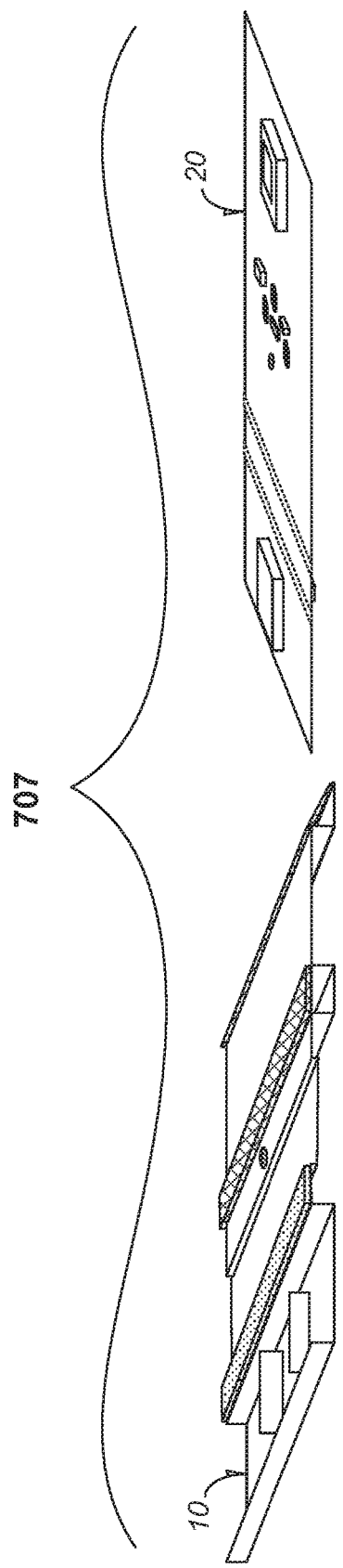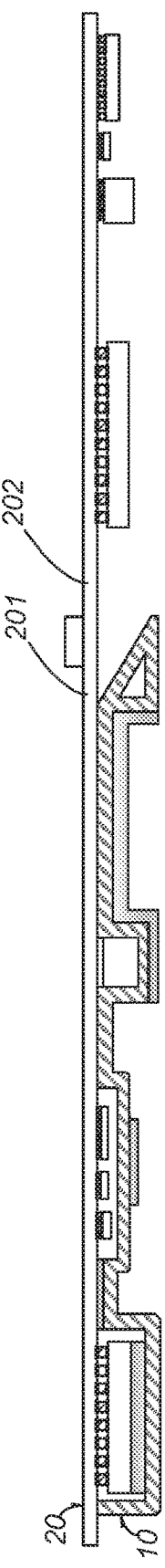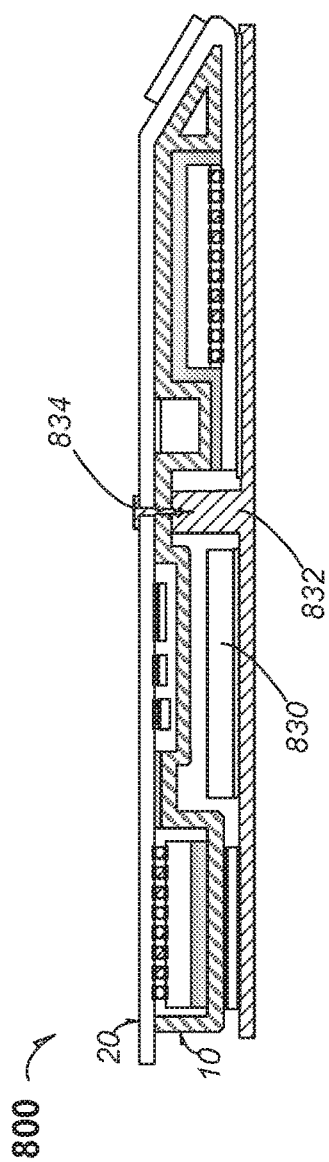

LEAD FRAME WITH ANGULAR DEFLECTIONS AND WRAPPED PRINTED WIRING BOARDS FOR SYSTEM-IN-PACKAGE APPARATUS

PRIORITY APPLICATION

This application is a U.S. National Stage Application under 35 U.S.C. 371 from International Application No. PCT/US2016/069147, filed Dec. 29, 2016, published as WO2018/125125 A1, which is incorporated herein by reference in its entirety.

FIELD

This disclosure relates to system-in-package configurations where a printed wiring board is wrapped onto a lead frame with contours.

BACKGROUND

Package miniaturization poses device-integration challenges, where both active and passive devices require physical protection and heat management while miniaturizing the package.

BRIEF DESCRIPTION OF THE DRAWINGS

Disclosed embodiments are illustrated by way of example, and not by way of limitation, in the figures of the accompanying drawings where like reference numerals may refer to similar elements, in which:

FIG. 1 is a cross-section elevation of a lead frame according too an embodiment;

FIG. 2 is a cross-section elevation of a system-in-package apparatus according to an embodiment;

FIG. 8 is a system in package an apparatus according to an embodiment;

DETAILED DESCRIPTION

Figure 2A:
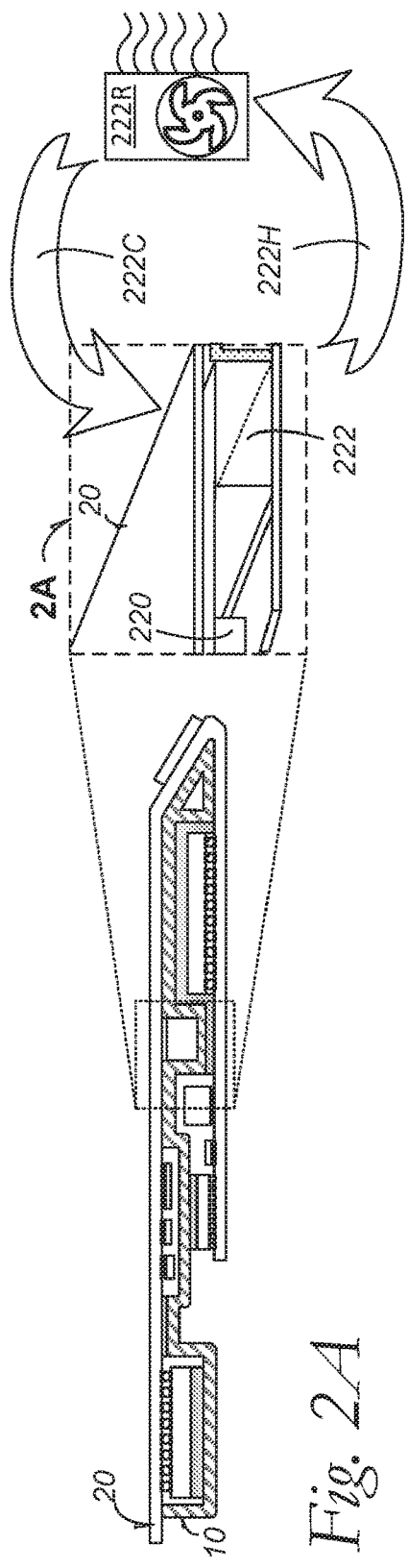
FIG. 2A is a perspective extract taken from FIG. 2 that illustrates a portion of the printed wiring board and other structures around the first cooling compartment including the subsequent thermal interface material according to an embodiment.

Disclosed embodiments square-wave lead frame structures that accommodated both active- and passive devices, where the lead frame provides heat management, package rigidity, as well as device protection that are part of system-in-package apparatus. Equipment that uses digital methods that operate at a total digital transfer rate exceeding 50 gigabits/second (Gbit/s) is presented that may be used, whether for electrical, optical or wireless communication. Unidirectional data-transfer speeds at an interface may be above 50 Gbit/s, and for radio frequency communication above 32 GHz.

Mobile and wearable applications of disclosed embodiments are facilitated by mechanical stability and device protection, while also providing small and flat form factors as well as useful cooling for heat-generating devices. Low Z-direction and thermal management embodiments of system in package apparatus are achieved by coupling integrated circuit device backsides through thermal interface materials (TIMs) to square-wave lead frames. Additionally, the integrated circuit devices are disposed on a printed wiring hoard (PWB) that is wrapped onto the square-wave lead frame. More generally, the square-wave lead frame may refer to deflected lead frame structures that are wrapped with a printed wiring board (PWB) such that active device cooling is intrinsically provided by the lead frame that also provides a low Z-profile, device protection, and mechanical stability. Although "lead frame" is used, in general the lead frame embodiments may be angularly deflected structures. In an embodiment, the lead frame 10 is a plastic-graphite-metal composite.

FIG. 1 is a cross-section elevation 100 of a lead frame 10 according to an embodiment. The lead frame 10 may be stamped from a metal sheet, such as heat-sink grade copper, to achieve a desired shape and topology for packaging semiconductive and passive devices. The stamping process may also achieve holes through the lead frame 10 as useful. As the lead frame 10 is pressed and stamped into a deflected, sometimes rectangular wave form configuration that is a basis for system in package apparatus embodiments, the wave form is designed to fit the topology of the devices that are mounted in recesses or on prominences but that are also mounted onto a printed wiring board (PWB 20, see FIG. 2). The lead frame 10 and the wrapped PWB 20 provide specialized device-holding and device-cooling compartments. The PWB 20 wraps around the lead frame 10 and devices on the PWB 20 are inserted into tailored compartments. The tailored compartments provide cooling as well as structural protection for the devices. The wrapped PWB 20 is both thermally and mechanically attached to the lead frame 10 to obtain useful heat managements as well as mechanical stability.

As many of the shape changes in the lead frame 10 appear to be rectangular, the lead frame 10 may be referred to as a "square-wave" lead frame 10, although shape changes may be more generally referred to as "angular deflections" or merely "deflections".

The lead frame 10 as illustrated includes several planar surfaces, among which are surfaces 11, 12, 13, 14, 15, 16, 17, 18 and 19. Although there are more planar surfaces, many of these delineations will be used in this disclosure. A "planar surface" may refer to a surface that is sufficiently flat to allow the mounting of a device, whether an active or a passive device within the ordinary usage of semiconductive device packaging onto surfaces. Selected planar surfaces may be useful for contact and adhesion to a printed wiring hoard. Similarly, a planar surface may be referred to as a "recess" where at least one adjoining angular deflection creates part of a concave structure. Examples of planar surfaces that may be termed as recesses include items 11, 12, 13, 15, 16 and 18. Additionally, a planar surface may be referred to as a "prominence" where at least one adjoining angular deflection creates part of a convex surface. Examples of prominences include items 12' and 16'.

The lead frame 10 as illustrated includes a first deflection 101, a second deflection 102, third deflection 103, a fourth deflection 104, a fifth deflection 105, a sixth deflection 106, a seventh deflection 107, an eighth deflection 108, a ninth deflection 109, a tenth deflection 110, an eleventh deflection 111, a twelfth deflection 112, a thirteenth deflection 113, and a subsequent deflection 114.

FIG. 2 is a cross-section elevation of a system-in-package apparatus 200 according to an embodiment. The system-in-package apparatus 200 includes an occurrence of the lead frame 10 depicted in FIG. 1. Reference between FIG. 2 and FIG. 1 is useful.

The system-in-package apparatus 200 includes the lead frame 10 including a first recess 11 and the printed wiring board (PWB) 20 in contact with the lead frame 10. The PWB 20 spans the first recess 11, and the PWB 20 exhibits a first angular fold 201 in contact with the lead frame 10 at the planar surfaces 16' and 17. The PWB 20 may also be adhesively attached to the lead frame 10 at the prominence 12' by a thermal interface adhesive material 204 such as a reflowed metal film or an organic film. In an embodiment, the first angular fold 201 may be a smooth contour where in this example the twelfth deflection 112 is also smooth.

In an embodiment, the system-in-package apparatus 200 includes a first semiconductive device 130 disposed on the PWB 20 that is also thermally in contact with the lead frame 10 through a thermal interface material (TIM) 132. In an embodiment, the first semiconductive device 130 is a main processor such as a processor manufactured by Intel Corporation of Santa Clara, Calif.

A subsequent device 134 disposed on the PWB 20 and it is in contact with the lead frame 10 through a subsequent thermal interface material 136, It can be seen that the system-in-package apparatus 200 may be structurally defined where the first and subsequent devices 130 and 134 are each disposed on the PWB 20 and they are separated, or set apart, by the PWB angular fold 201. Whether a recess or a prominence is designated, a usefully planar surface is presented that may be referred to as a feature for accommodating a device, whether it is an active device or a passive device, Consequently, item 16 may be referred to as a recess 16 for accommodating the first semiconductive device 130, and item 11 may be referred to as a feature for accommodating the device 134. In an embodiment, the device 134 is a baseband processor that is shielded at least on three sides by the lead frame 10. Attention is directed to FIG. 7, where the recess 11 may be located next to at least one flap for shielding 712.

In an embodiment, a third device 140 is also disposed on the PWB 20 and a thermal interface material (TIM) 142 contacts the third device 140 and creates a thermal channel between the third device 140 and the lead frame 10. In an embodiment, the third device 140 is a memory die such as a non-volatile, flash-technology device 140. In an embodiment, the third device 140 is a power amplifier.

In an embodiment, the PWB 20 includes both the first angular fold 201 and a second angular fold 202, and an external device 210 is disposed between the first- and second respective angular folds 201 and 202. The external device 210 is referred to as such as it is mounted on the PWB 20 on the surface opposite the other devices, e.g., the processor 130 and the baseband processor 134. In an embodiment, the external device 210 is a power amplifier. In an embodiment, the external device 210 is a transceiver.

Other useful devices may be found on the PWB 20. In an embodiment, transceiver-support devices 212, 214, and 216 are disposed on the PWB 20 in a location that is near the baseband processor 134. For example, the device 212 may be a balun 212 for the baseband processor 134. Other devices 218 and 220 are located on the PWB 20 near the third device 140.

In an embodiment where significant heat is generated by the device 130, cooling functions may be assigned to the recesses 15 and 18 such that a first cooling compartment 222 and a subsequent cooling compartment 224 may be formed. In the illustrated embodiment, the first cooling compartment 222 is facilitated by compartment sealing 226, but the subsequent cooling compartment 224 is fully enclosed by the lead frame 10. In an embodiment, the first cooling compartment 222 is a cooling compartment fluid heat sink.

Reference is made to FIG. 2A. A perspective extract 2A illustrates a portion of the PWB 20 and other structures around the first cooling compartment 222 including the subsequent thermal interface material 136. As illustrated, the first cooling compartment 222 may be filled with a cooling fluid. In an embodiment, a heat pipe system may include a hot stream 222H, depicted figuratively, a heat-rejection device 222R, and a cold stream 222C, also depicted figuratively, that returns the cooling fluid to the first cooling compartment. With a "square wave" lead frame 10, heat transfer may be conducted throughout the lead frame 10 until a cooling compartment is encountered such as the first cooling compartment 222. Both conventional and innovational heat-pipe implementations may be employed.

In an embodiment, convectional heat exchange may be used such as is represented by a fan symbol within the heat-rejection device 222R. In an embodiment, no fan is used and heat exchange is based upon ambient-air channel movement within the first cooling compartment by natural convection.

By wrapping the PWB 20 around the lead frame 10, there is no particular need for a core in the PWB 20 as the lead frame 10 may lend useful rigidity to the PWB 20, while the lead frame 10 also acts as a heat sink. In an embodiment, lead frame 10 also acts as a fundamental form factor for system-in-package apparatus embodiments. Where a heat-generating device may only contact a heat sink on one of the six surfaces typical of a conventional device, the subsequent device 140 may be contacted on five of six (three of the six shown in FIGS. 2 and 2A in cross-section) such that heat exchange is increased.

Depending upon usage, the system in package apparatus may have open or sealed compartments to facilitate heat management. In an embodiment, the first cooling compartment 222 is left with open ends to allow ambient-condition air flow through the first cooling compartment 222. In an embodiment, the first cooling compartment 222 is sealed after a fluid is flooded into the first cooling compartment 222 to add mass to the heat-sink capabilities. In an embodiment, the first cooling compartment 222 is filled with a cooling fluid and the cooling fluid is cycled between hot- and cold spaces. In an embodiment, a device such as a fan is used to move a cooling fluid into- and out of the hot space. In an embodiment, a device such as a fan is used to move a cooling fluid into- and out of the hot space and cycles the cooling fluid to a cold space before being returned to the first cooling compartment 222. In any event, useful cooling is achieved by the lead frame 10 being in close contact with significant heat-generating devices, compared to where many devices in a system would only contact a FR4-type PWB.

Figure 3:
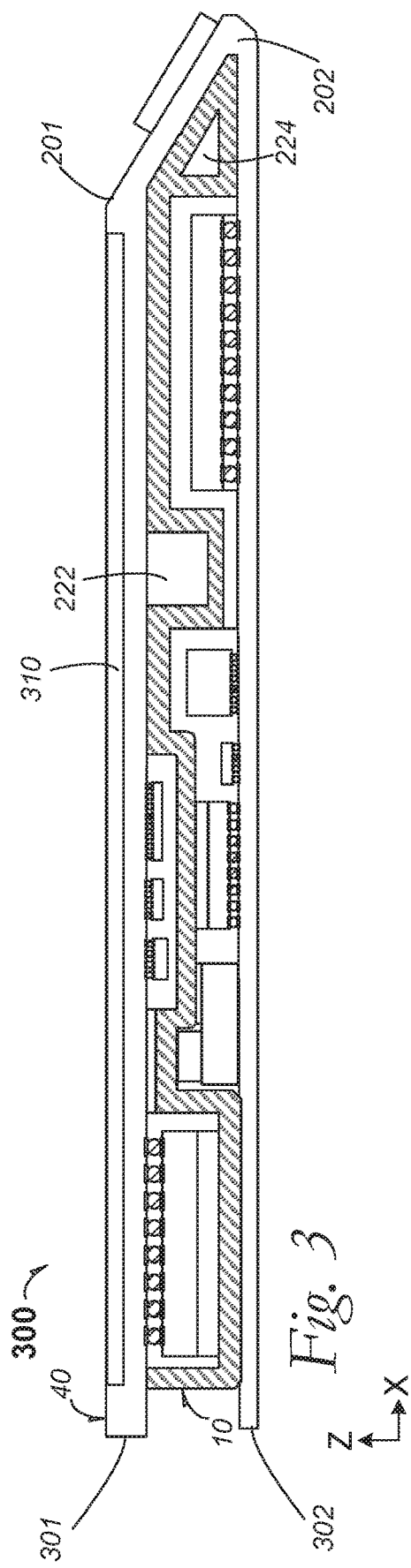
FIG. 3 is a cross-section elevation of a system in package apparatus according to an embodiment.

FIG. 3 is a cross-section elevation of a system in package apparatus 300 according to an embodiment.

The lead frame 10 is wrapped with a printed wiring board 40. The PWB 40 is wrapped onto the lead frame 10 at the first- and second angular folds 201 and 202. In an embodiment, the PWB 10 also extends the full length of the lead frame 10 until it essentially encloses lead frame 10 such that a first end 301 is essentially at the same X-coordinates as a second end 302.

In an embodiment, the system in package apparatus 300 has an embedded display 310 that is affixed to the PWB 40. It can be seen that a computing device may include the embedded display 310 and sufficient components are mounted on the PWB 40 and heat-exchanged by the lead frame 10 that the system in package apparatus 300 may be a hand-held computing device.

Figure 4:
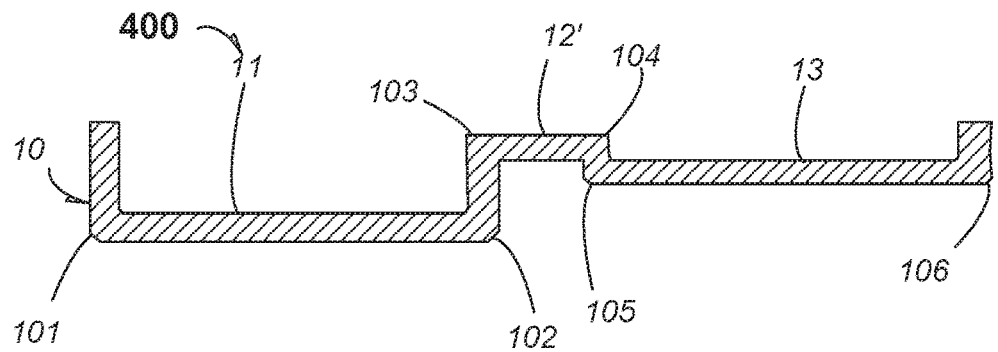
FIG. 4 is a cross-section elevation of a lead frame according to an embodiment.

FIG. 4 is a cross-section elevation of a lead frame 10 according to an embodiment. The lead frame 10 includes a first recess 11, a prominence 12' and a second recess 13. The lead frame 10 includes a first deflection 101, a second deflection 102, third deflection 103, a fourth deflection 104, a fifth deflection 105, and a sixth deflection 106.

Figure 5:
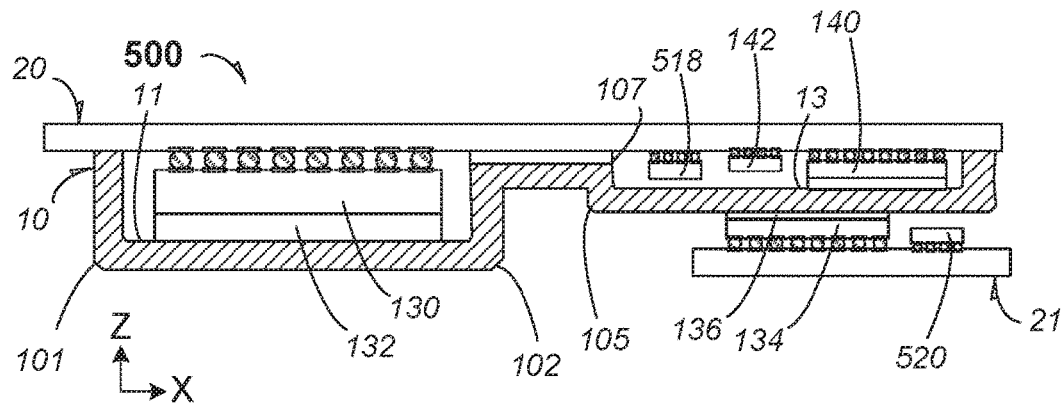
FIG. 5 is a cross-section elevation of a system-in-package apparatus according to an embodiment.

FIG. 5 is a cross-section elevation of a system-in-package apparatus 500 according to an embodiment. The system-in-package apparatus 500 includes an occurrence of the lead frame 10 depicted in FIG. 4. Reference between FIG. 4 and FIG. 5 is useful.

The system-in-package apparatus 500 includes the lead frame 10 including a first recess 11 and a printed wiring board (PWB) 20 in contact with the lead frame 10. The PWB 20 spans the first recess 11 and the second recess 13. In an embodiment, the system-in-package apparatus 500 includes a first semiconductive device 130 disposed on the PWB 20 that is also thermally in contact with the lead frame 10 through a TIM 132. In an embodiment, the first semiconductive device 130 is a main processor such as a processor manufactured by Intel Corporation of Santa Clara, Calif. The processor 130 is also shielded by virtue of being seated in upon the PWB 20, but within the first recess 11.

A subsequent device 134 disposed on a PWB 21 and it is in contact with the lead frame 10 through a subsequent thermal interface material 136. In an embodiment, the subsequent device 134 is a memory chip.

It can be seen that the system-in-package 500 may be structurally defined where the first- and subsequent devices 130 and 134 are respectively disposed on the PWBs 20 and 21. The form factor of the lead frame 10 allows for all devices to be within the Z-dimension of the of the lead frame 10 and the first PWB 20. Consequently, no devices need be disposed on the PWB 20 except for one side.

In an embodiment, a third device 140 is also disposed on the PWB 20 and the third device 140 is a baseband processor die and a fourth device 142 is a balun that services the baseband processor 142. Other devices 518 and 520 are located on the respective PWBs 20 and 21.

Figure 6:
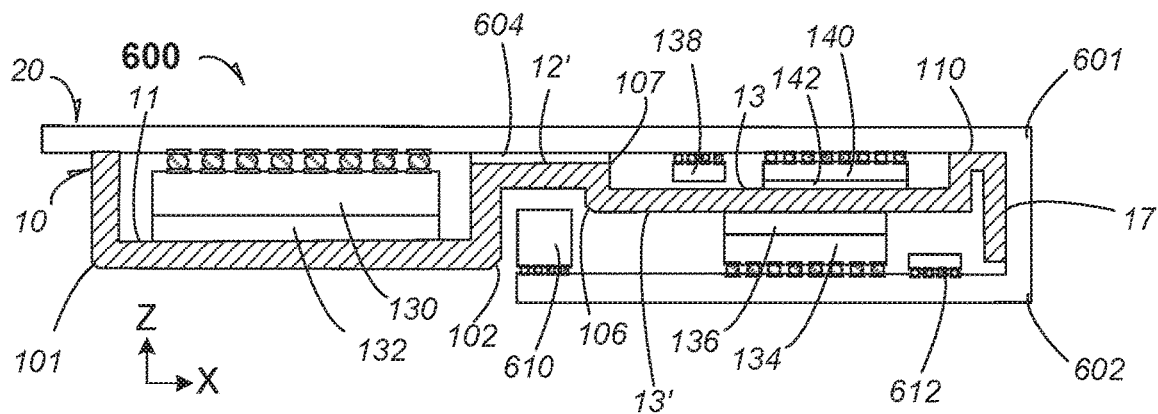
FIG. 6 is a cross-section elevation a system-in-package apparatus according to an embodiment.

FIG. 6 is a cross-section elevation of a system-in-package apparatus 600 according to an embodiment. The system-in-package apparatus 600 includes a lead frame 10 including a first recess 11, a first prominence 12', a second recess 13, and a second prominence 13'. The system-in-package apparatus 600 also includes a printed wiring board (PWB) 20 in contact with the lead frame 10. The PWB 20 spans the first recess 11, the second recess 13 and the second prominence 13'. The PWB 20 exhibits a first angular fold 601 in contact with the lead frame 10 at the planar surface 17. The PWB 20 is also adhesively attached to the lead frame 10 at the prominence 12' by an adhesive material 604.

In an embodiment, the system-in-package apparatus 600 includes a first semiconductive device 130 disposed on the PWB 20 within the first recess 11. The first semiconductive device 130 is also thermally in contact with the lead frame 10 through a thermal interface material (TIM) 132. In an embodiment, the first semiconductive device 130 is a main processor such as a processor manufactured by Intel Corporation of Santa Clara, Calif.

A subsequent device 134 disposed on the PWB 20 upon a prominence 13' and it is in contact with the lead frame 10 through a subsequent thermal interface material 136. In an embodiment, the subsequent semiconductive device 134 is memory die such as a flash memory device. In an embodiment, a baseband processor 140 is mounted on the PWB 20 and is also in thermal contact with the lead frame 10 through a TIM 142. The baseband processor 140 is also shielded by virtue of being seated in upon the PWB 20, but within the first recess 11 of the lead frame 10.

It can be seen that the system-in-package 600 may be structurally defined where the first- and subsequent devices 130 and 134 are each disposed on the PWB 20 and they are separated, or set apart, by the PWB angular folds 601 and 602.

Other useful devices may be found on the PWB 20. In an embodiment, a transceiver-support device 138 such as a balun is disposed on the PWB 20 in a location that is near the baseband processor 140. Additionally, a tall device 610 is located below the prominence 12' of the lead frame. In an embodiment, a passive device 612 is located on the PWB 20 near the subsequent device 134.

FIGS. 7A, through 7H illustrate a method of assembling a system in package apparatus on a square wave lead frame according to an embodiment.

In FIG. 7A a lead frame precursor 701 is provided. In an embodiment, the lead frame precursor 701 is a heat-sink grade copper sheet.

In FIG. 7B, the structure 702 is a square wave lead frame 10 similar to the lead frame 10 depicted in FIG. 1. The lead frame 10 has been stamped and punched from the lead frame precursor 701 depicted in FIG. 7A. A slot 710 is formed by cutting a folding a flap for shielding 712. Also, a fastening hole 714 is formed by a hole punch. In forming the square wave lead frame 10, a prominence 12' is formed similar to the prominence 12' depicted in FIG. 1. By this process, a 3-dimensional rectangular wave structure is seen that forms compartments for both active- and passive devices for both cooling and physical protection utilities.

In FIG. 7C, a thermal interface material 204 is attached on the lead frame 10 at the prominence 12' location on the lead frame 10. It is useful to refer both to FIGS. 7B and 7C. Additionally, a compartment sealing 226 is affixed over the recess 15 to form a first cooling compartment 222. Unlike the two additional angular deflections 113 and 114 depicted in FIG. 1, a triangular compartment sealing 227 is affixed onto the lead frame 10 to enclose the recess 18 to form a second cooling compartment 224.

Figure 7D:
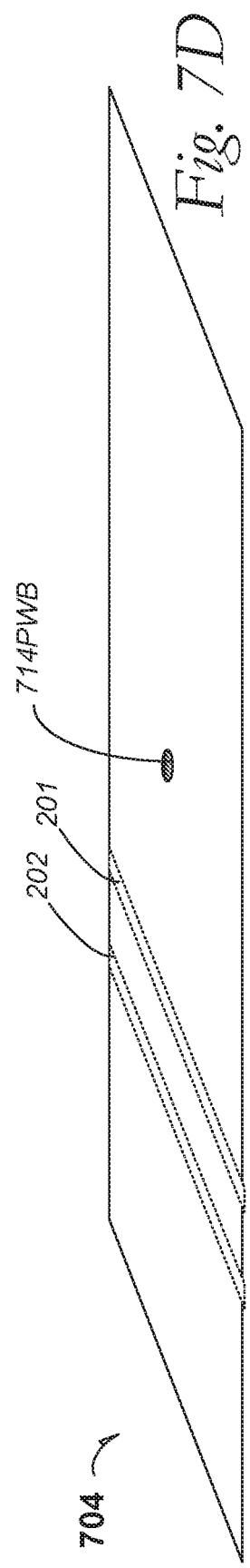
FIGS. 7A, through 7H illustrate methods of assembling a system in package apparatus on a square wave lead frame according to an embodiment.

In FIG. 7D, an assembly stage 704 is depicted with the printed wiring board 20 of FIG. 1. In an embodiment, the PWB 20 includes fold-capable flexible regions such as for the first and second angular folds 201 and 202 respectively. Additionally, a hole 714PWB is formed to align with the fastening hole 714 on the lead frame 10.

Figure 7E:
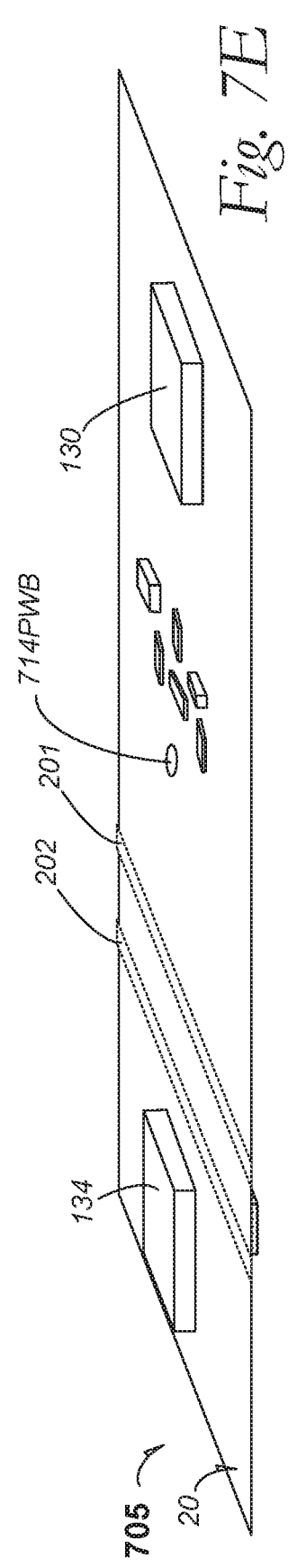

In FIG. 7E, an assembly stage 705 is depicted with the PWB 20 providing landing sites for the first semiconductive device 130 and the subsequent semiconductive device 134. Other device groupings are also shown being placed at design-useful sites between the hole 714PWB and the subsequent semiconductive device 134.

Figure 7F:
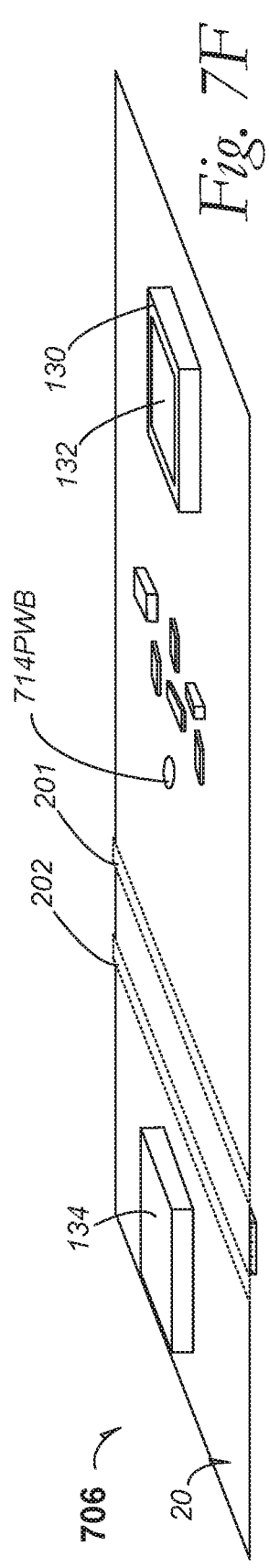

In FIG. 7F, an assembly stage 706 is depicted where a thermal interface material 132 has been assembled to the first semiconductive device 130.

In FIG. 7G, an assembly stage 707 is depicted where the lead frame 10 with added structure is presented to the PWB 20 with added structure. In a non-limiting example embodiment, separate and unrelated economic entities produce the lead frame 10 and the PWB 20. In an embodiment, a first entity produces the PWB 20, a second entity produces the first semiconductive device 134, and a subsequent entity produces the lead frame 10.

In FIG. 7H, the lead frame 10 is being mated to the PWB 20. After mating the lead frame 10 and the PWB 20 with attached devices, the PWB is wrapped by bending at the angular folds 201 and 202 to achieve the system in package apparatus 100 depicted in FIG. 1.

FIG. 8 is a system in package an apparatus 800 according to an embodiment. An external component 830 is assembled to a housing structure 832 such as a rigid external shell. In an embodiment, the housing structure 832 carries an external component 830 such as a battery. In an embodiment, the housing structure 832 is affixed to the lead frame 10 by a fastener 834 such as a screw that attaches through the fastening holes (see items 714 and 714PWB in respective FIGS. 7C and 7D). In an embodiment, the fastener is a rivet.

As the PWB 20 is wrapped around the lead frame 10, the PWB 20 does not completely envelop the lead frame 10, but the housing structure 834 completes closure started by the PWB 20.

Figure 9:
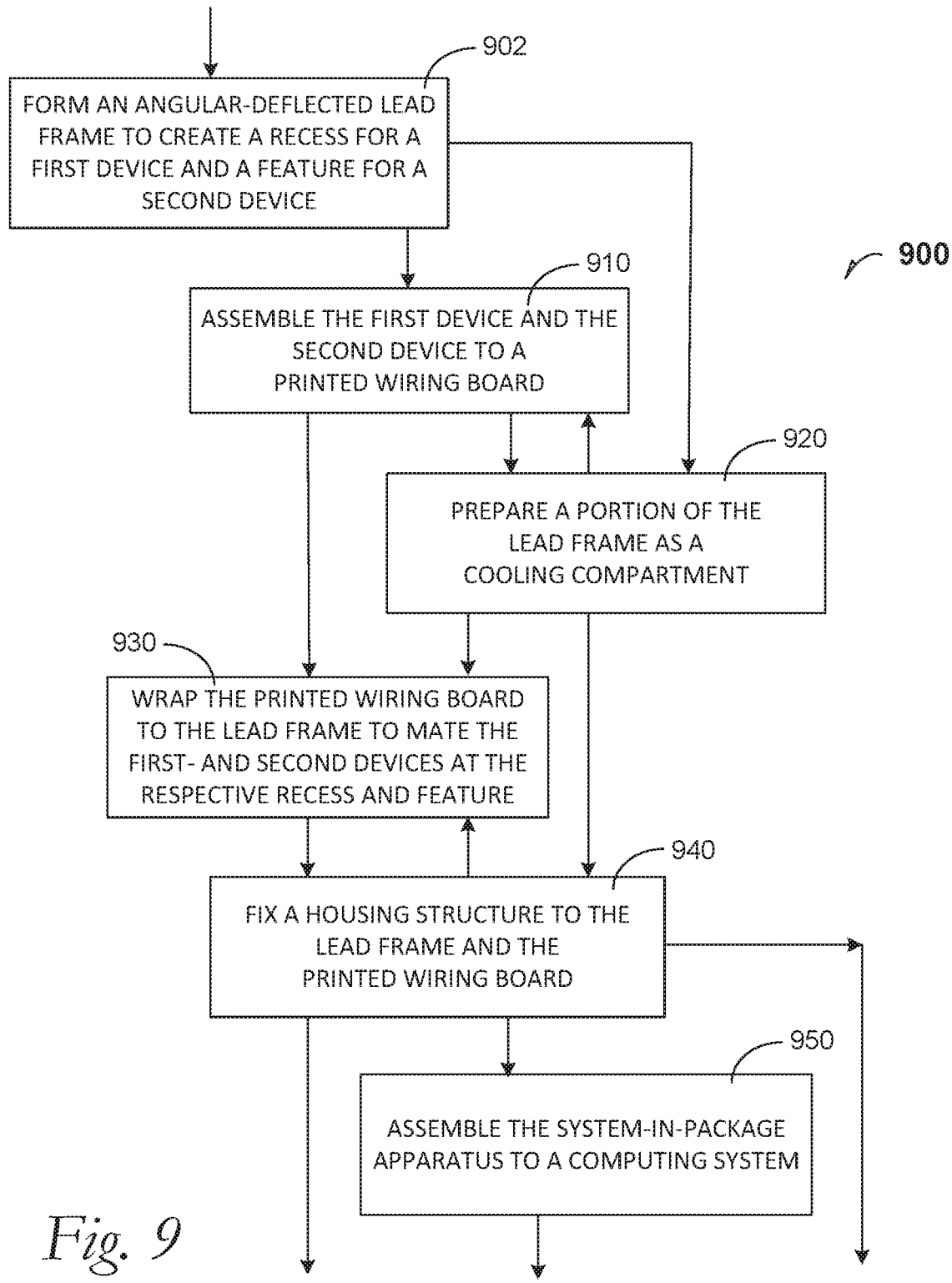
FIG. 9 is a process flow diagram according to an embodiment.

FIG. 9 is a process flow diagram 900 according to an embodiment.

At 902, the process includes forming an angular-deflected lead frame to create a recess for accommodating a first device and a feature for accommodating a second device. In an non-limiting example embodiment seen in FIGS. 1 and 2, item 11 is a recess 11 formed in the lead frame 10 for accommodating the device 130, and item 16 is a feature 16 (in this instance, a recess 16) for accommodating the device 134.

At 910, the process includes assembling the first- and second devices to a printed wiring board. In a non-limiting example embodiment seen in FIG. 7E, the devices 130 and 134 are assembled to the PWB 20. Placement locations of the devices 130 and 134 are calculated to allow mating of the devices 130 and 134 to the first- and second features 11 and 16, respectively.

At 920, the process includes preparing a portion of the lead frame as a cooling compartment. In a non-limiting example embodiment illustrated in FIG. 7C, the compartment sealing 226 structure is located to create the first cooling compartment 222 and optionally if present, the compartment sealing 227 structure is located to create the subsequent cooling compartment 224. Process flow may therefore originate at 902, move to 920, and next move to 910.

At 930, the process includes wrapping the PWB to the lead frame to mate the first- and second devices at the respective recess and feature. In a non-limiting example embodiment depicted sequentially in FIG. 7H and FIG. 2, the PWB 20 is wrapped onto the lead frame by flexing at the first- and second angular folds 201 and 202 as seen in FIG. 7H, and wrapping is completed as seen in FIG. 2.

At 940, the process includes fixing a housing structure to the lead frame and printed wiring hoard. In a non-limiting example embodiment depicted in FIG. 8, a housing structure 832 that carries an external component 830 such as a battery is fixed to the lead frame 10 and the PWB 20.

At 950, the process includes assembling the system in package to a computing system. In a non-limiting example embodiment, the computing system depicted in FIG. 10 is a completed computing system that includes any disclosed system in package apparatus embodiment containing a square-wave lead frame and a wrapped printed wiring board.

Figure 10:
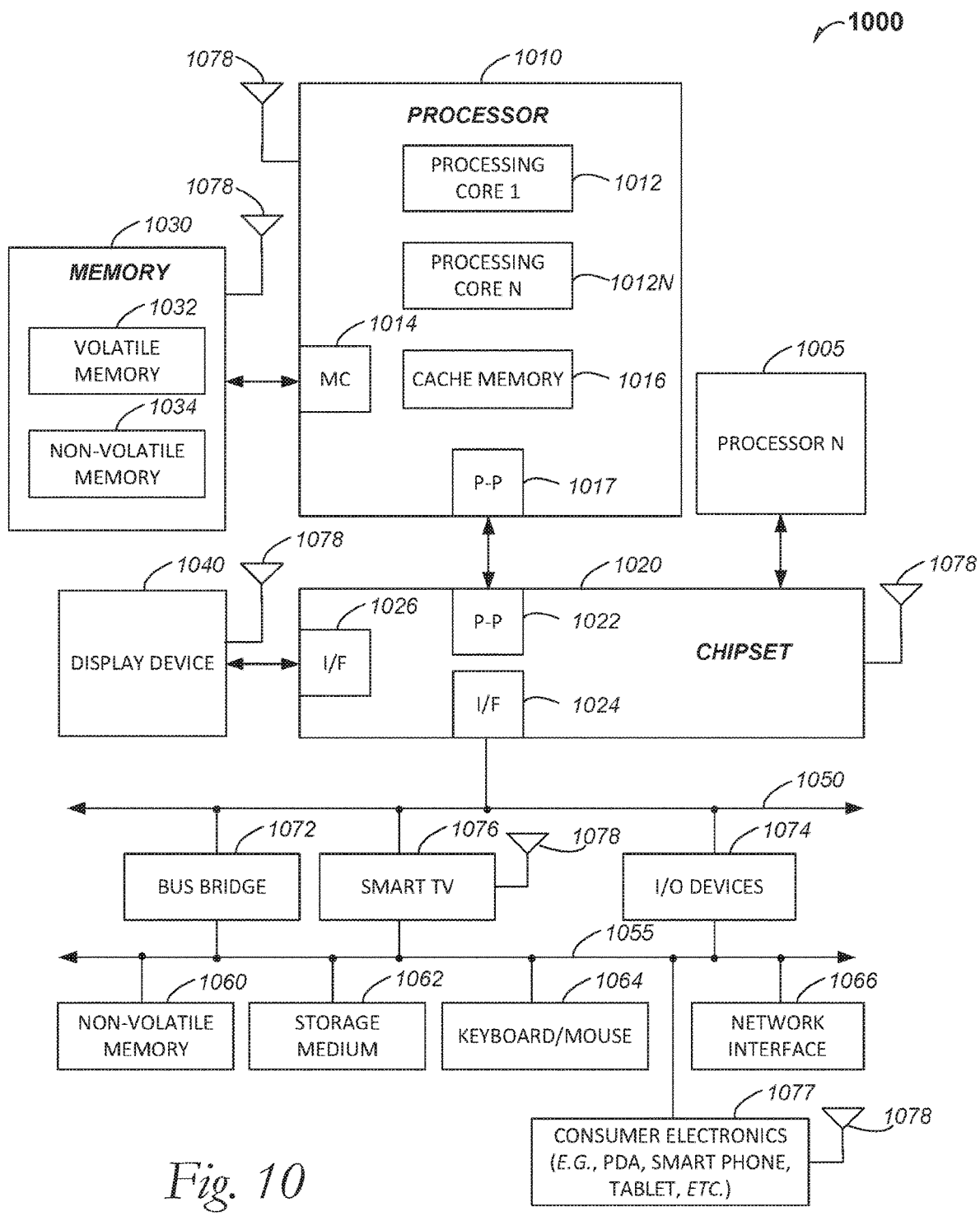
FIG. 10 is a computing system according to an embodiment.

FIG. 10 is a computing system 1000 according to an embodiment. FIG. 10 illustrates a system level diagram, according to one embodiment of the invention. For instance, FIG. 10 depicts an example of a microelectronic device that includes a system-in-package apparatus with a square-wave lead frame and a wrapped printed wiring board embodiment as described in the present disclosure.

FIG. 10 is included to show an example of a higher level device application for the disclosed embodiments. In an embodiment, a system 1000 includes, but is not limited to, a desktop computer. In an embodiment, a system 1000 includes, but is not limited to a laptop computer. In an embodiment, a system 1000 includes, but is not limited to a netbook. In an embodiment, a system 1000 includes, but is not limited to a tablet. In an embodiment, a system 1000 includes, but is not limited to a notebook computer. In an embodiment, a system 1000 includes, but is not limited to a personal digital assistant (PDA). In an embodiment, a system 1000 includes, but is not limited to a server. In an embodiment, a system 1000 includes, but is not limited to a workstation. In an embodiment, a system 1000 includes, but is not limited to a cellular telephone. In an embodiment, a system 1000 includes, but is not limited to a mobile computing device. In an embodiment, a system 1000 includes, but is not limited to a smart phone. In an embodiment, a system 1000 includes, but is not limited to an Internet appliance. Other types of computing device may be configured with the microelectronic device that includes a system-in-package apparatus with a square-wave lead frame and a wrapped printed wiring board embodiment.

In some embodiments, the system-in-package apparatus with a system-in-package apparatus with a square-wave lead frame and a wrapped printed wiring board embodiment 1000 includes a system on a chip (SOC) system.

In an embodiment, the processor 1010 has one or more processing cores 1012 and 1012N, where 1012N represents the Nth processor core inside processor 1010 where N is a positive integer. In an embodiment, the electronic device system 1000 using a system-in-package apparatus with a square-wave lead frame and a wrapped printed wiring board embodiment that includes multiple processors including 1010 and 1005, where the processor 1005 has logic similar or identical to the logic of the processor 1010. In an embodiment, the processing core 1012 includes, but is not limited to, pre-fetch logic to fetch instructions, decode logic to decode the instructions, execution logic to execute instructions and the like. In an embodiment, the processor 1010 has a cache memory 1016 to cache at least one of instructions and data for the SiP device system 1000. The cache memory 1016 may be organized into a hierarchal structure including one or more levels of cache memory.

In an embodiment, the processor 1010 includes a memory controller 1014, which is operable to perform functions that enable the processor 1010 to access and communicate with memory 1030 that includes at least one of a volatile memory 1032 and a non-volatile memory 1034. In an embodiment, the processor 1010 is coupled with memory 1030 and chipset 1020. The processor 1010 may also be coupled to a wireless antenna 1078 to communicate with any device configured to at least one of transmit and receive wireless signals. In an embodiment, the wireless antenna interface 1078 operates in accordance with, but is not limited to, the IEEE 802.11 standard and its related family, Home Plug AV (HPAV), Ultra Wide Band (UWB), Bluetooth, WiMax, or any form of wireless communication protocol.

In an embodiment, the volatile memory 1032 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. The non-volatile memory 1034 includes, but is not limited to, flash memory, phase change memory (PCM), read-only memory (ROM), electrically erasable programmable read-only memory (EEPROM), or any other type of non-volatile memory device.

The memory 1030 stores information and instructions to be executed by the processor 1010. In an embodiment, the memory 1030 may also store temporary variables or other intermediate information while the processor 1010 is executing instructions. In the illustrated embodiment, the chipset 1020 connects with processor 1010 via Point-to-Point (PtP or P-P) interfaces 1017 and 1022. Either of these PtP embodiments may be achieved using a system-in-package apparatus with a square-wave lead frame and a wrapped printed wiring board embodiment as set forth in this disclosure. The chipset 1020 enables the processor 1010 to connect to other elements in the SiP device system 1000. In an embodiment, interfaces 1017 and 1022 operate in accordance with a PtP communication protocol such as the Intel® QuickPath. Interconnect (QPI) or the like. In other embodiments, a different interconnect may be used.

In an embodiment, the chipset 1020 is operable to communicate with the processor 1010, 1005N, the display device 1040, and other devices 1072, 1076, 1074, 1060, 1062, 1064, 1066, 1077, etc. The chipset 1020 may also be coupled to a wireless antenna 1078 to communicate with any device configured to at least do one of transmit and receive wireless signals.

The chipset 1020 connects to the display device 1040 via the interface 1026. The display 1040 may be, for example, a liquid crystal display (LCD), a plasma display, cathode ray tube (CRT) display, or any other form of visual display device. In and embodiment, the processor 1010 and the chipset 1020 are merged into a single SOC. Additionally, the chipset 1020 connects to one or more buses 1050 and 1055 that interconnect various elements 1074, 1060, 1062, 1064, and 1066. Buses 1050 and 755 may be interconnected together via a bus bridge 1072. In an embodiment, the chipset 1020 couples with a non-volatile memory 1060, a mass storage device(s) 1062, a keyboard/mouse 1064, and a network interface 1066 by way of at least one of the interface 1024 and 1074, the smart TV 1076, and the consumer electronics 1077, etc.

In and embodiment, the mass storage device 1062 includes, but is not limited to, a solid state drive, a hard disk drive, a universal serial bus flash memory drive, or any other form of computer data storage medium. In one embodiment, network interface 1066 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 10 are depicted as separate blocks within the SiP apparatus in a computing system 1000, the functions performed by some of these blocks may be integrated within a single semiconductor circuit or may be implemented using two or more separate integrated circuits. For example, although cache memory 1016 is depicted as a separate block within processor 1010, cache memory 1016 (or selected aspects of 1016) can be incorporated into the processor core 1012. Where useful, the computing system 1000 may have an outer shell that is part of the several land side board embodiments described in this disclosure. For example in FIG. 1, arrow 20 indicates the PWB 20, but the arrow touches the PWB on the surface opposite where all devices are mounted. Where arrow 20 touches the PWB may also be at least part of an outer shell. Similarly and additionally, the housing structure 832 depicted in FIG. 8 may be at least part of an outer shell and the portion of the PWB 20 depicted in FIG. 8 that is opposite the side were devices are mounted, and not covered by the housing structure 832, may be part of the outer shell of the computing system 1000 depicted in FIG. 10.

To illustrate the system-in-package apparatus with a package bottom interposer embodiment and methods disclosed herein, a non-limiting list of examples is provided herein:

Example 1 is a system-in-package apparatus comprising: a lead frame including a first recess therein and a feature; a printed wiring board (PWB) in contact with the lead frame, wherein the PWB spans the first recess, and wherein the PWB exhibits an angular fold in contact with the lead frame; a first semiconductive device disposed on the PWB and in the first recess; and a subsequent device disposed on the PWB and in the feature.

In Example 2, the subject matter of Example 1 optionally includes wherein the first semiconductive device is in contact with the lead frame through a first thermal interface material, and wherein the subsequent device is in contact with the lead frame through a subsequent thermal interface material.

In Example 3, the subject matter of any one or more of Examples 1-2 optionally include wherein the first recess is defined by a first angular deflection, a first planar section in the first recess, and a second angular deflection.

In Example 4, the subject matter of any one or more of Examples 1-3 optionally include wherein the first- and subsequent devices are disposed on the PWB and are separated by the PWB angular fold.

In Example 5, the subject matter of any one or more of Examples 1-4 optionally include wherein the first- and subsequent devices are disposed on the PWB and are separated by the PWB angular fold, wherein the angular fold is a first angular fold, further including: a second angular fold in the PWB; and a third device disposed on the PWB.

In Example 6, the subject matter of any one or more of Examples 1-5 optionally include wherein the subsequent device and a subsequent device thermal interface material are separated by a first cooling compartment, only by a portion of the lead frame.

In Example 7, the subject matter of any one or more of Examples 1-6 optionally include wherein the subsequent device and a subsequent device thermal interface material are separated by a first cooling compartment, only by a portion of the lead frame, and wherein the subsequent device and subsequent device TIM are also separated by a second cooling compartment, only by a portion of the lead frame.

In Example 8, the subject matter of any one or more of Examples 1-7 optionally include wherein the first semiconductive device is disposed in the first recess.

In Example 9, the subject matter of any one or more of Examples 1-8 optionally include wherein the first semiconductive device is disposed in the first recess, further including: a second recess formed in the lead frame; and at least one device disposed in the second recess.

Example 10 is a system-in-package apparatus comprising: a lead frame including a first angular deflection and a second angular deflection, wherein the lead frame includes a first planar section adjacent the first angular deflection, and including a second planar section set apart from the first planar section by the second angular deflection; a printed wiring board (PWB) in contact with the lead frame, wherein the PWB spans the second angular deflection and exhibits an angular fold in contact with the lead frame; and a first semiconductive device disposed on the PWB and between the first angular deflection and a second angular deflection.

In Example 11, the subject matter of Example 10 optionally includes wherein each of the first angular deflection and the second angular deflection is a rectangular deflection.

In Example 12, the subject matter of any one or more of Examples 10-11 optionally include wherein the PWB spans the lead frame second planar section.

In Example 13, the subject matter of any one or more of Examples 10-12 optionally include wherein the PWB twice spans the first angular deflection.

In Example 14, the subject matter of any one or more of Examples 10-13 optionally include wherein the PWB includes at least one angular fold, wherein the angular fold spans a rectangular deflection.

In Example 15, the subject matter of any one or more of Examples 10-14 optionally include wherein the first semiconductive device is in contact with the lead frame through a first thermal interface material, further including a subsequent device, and wherein the subsequent device is in contact with the lead frame through a subsequent thermal interface material.

In Example 16, the subject matter of any one or more of Examples 10-15 optionally include wherein the first semiconductive device is in contact with the lead frame through a first thermal interface material, further including: a subsequent device, and wherein the subsequent device is in contact with the lead frame through a subsequent thermal interface material; and a second device disposed on the second planar section, wherein the second planar section is part of a second recess in the lead frame.

Example 17 is a system-in-package apparatus comprising: a lead frame including a first recess and a second recess therein; a first printed wiring board (PWB) in contact with the lead frame, wherein the PWB spans the first recess and the second recess; a first semiconductive device disposed on the PWB; a subsequent PWB in contact with the lead frame; and a subsequent device disposed on the subsequent. PWB.

In Example 18, the subject matter of any one or more of Examples 10-17 optionally include a second device disposed on the PWB, wherein the second device is also disposed in the second recess.

In Example 19, the subject matter of any one or more of Examples 10-18 optionally include wherein the first PWB exhibits an angular fold in contact with the lead frame, and wherein the subsequent PWB is an integral part of the first PWB, and wherein the first and subsequent PWBs are defined at a border of the angular fold.

In Example 20, the subject matter of any one or more of Examples 10-19 optionally include wherein the first semiconductive device is in contact with the lead frame through a first thermal interface material, and wherein the subsequent device is in contact with the lead frame through a subsequent thermal interface material.

Example 21 is a method of assembling a system-in-package apparatus, comprising: forming an angular-deflected lead frame to create a recess for a first device and a feature for a second device; assembling a first device and a second device to a printed wiring board; and wrapping the printed wiring board onto the lead frame to mate the first device and the second device at the respective recess and feature.

In Example 22, the subject matter of Example 21 optionally includes wherein the recess is a first recess formed by two rectangular deflections, and wherein the feature is a subsequent recess formed by two rectangular deflections.

In Example 23, the subject matter of any one or more of Examples 21-22 optionally include preparing a portion of the lead frame as a cooling compartment, wherein the cooling compartment includes at least two surfaces of the lead frame, and further including attaching a compartment sealing structure to enclose the cooling compartment.

In Example 24, the subject matter of any one or more of Examples 21-23 optionally include preparing a portion of the lead frame as a first cooling compartment, wherein the first cooling compartment includes three surfaces of the lead frame, and further including attaching a compartment sealing structure to enclose the first cooling compartment; and preparing a portion of the lead frame as a subsequent cooling compartment, wherein the subsequent cooling compartment includes at least two surfaces of the lead frame, and further including attaching a subsequent compartment sealing structure to enclose the subsequent cooling compartment.

In example 25, a computing system including a system-in-package apparatus comprising: a lead frame including a first recess therein and a feature; a printed wiring board (PWB) in contact with the lead frame, wherein the PWB spans the first recess, and wherein the PWB exhibits an angular fold in contact with the lead frame; a first semiconductive device disposed on the PWB and in the first recess; a subsequent device disposed on the PWB and in the feature; and wherein a portion of the PWB includes an external shell for the computing system.

In Example 26, the subject matter of Example 25 optionally includes wherein the first semiconductive device is in contact with the lead frame through a first thermal interface material, and wherein the subsequent device is in contact with the lead frame through a subsequent thermal interface material.

In Example 27, the subject matter of Example 25 optionally includes wherein the first recess is defined by a first angular deflection, a first planar section in the first recess, and a second angular deflection.

In Example 28, the subject matter of Example 25 optionally includes, wherein the first- and second devices are disposed on the PWB and are separated by the PWB angular fold.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electrical device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. A system-in-package apparatus comprising:
a lead frame including a first recess therein and a feature;
a printed wiring board (PWB) in contact with the lead frame, wherein the PWB spans the first recess, and wherein the PWB exhibits an angular fold in contact with the lead frame;
a first semiconductive device disposed on the PWB and in the first recess; and
a subsequent device disposed on the PWB and in the feature, wherein the first semiconductive device and the subsequent semiconductive device do not electrically interact with the lead frame.

2. The system-in-package of claim 1, wherein the first semiconductive device is in contact with the lead frame through a first thermal interface material, and wherein the subsequent device is in contact with the lead frame through a subsequent thermal interface material.

3. The system-in-package of claim 1, wherein the first recess is defined by a first angular deflection, a first planar section in the first recess, and a second angular deflection.

4. The system-in-package of claim 1, wherein the first semiconductive device and subsequent semiconductive device are separated by the PWB angular fold.

5. The system-in-package of claim 1, wherein the first semiconductive device and subsequent semiconductive device are separated by the PWB angular fold, wherein the angular fold is a first angular fold, further including:
a second angular fold in the PWB; and
a third semiconductive device disposed on the PWB.

6. The system-in-package of claim 1, wherein the lead frame defines a first cooling compartment.

7. The system-in-package of claim 1, wherein the lead frame defines a first cooling compartment and a second cooling compartment.

8. The system-in-package of claim 1, wherein the first semiconductive device is disposed in the first recess.

9. The system-in-package of claim 1, wherein the first semiconductive device is disposed in the first recess, further including:
a second recess formed in the lead frame; and
at least one device disposed in the second recess.

10. A system-in-package apparatus comprising:
an electrically inactive lead frame including a first angular deflection and a second angular deflection, wherein the lead frame includes a first planar section adjacent the first angular deflection, and including a second planar section set apart from the first planar section by the second angular deflection;
a printed wiring board (PWB) in contact with the lead frame, wherein the PWB spans the second angular deflection and exhibits an angular fold in contact with the lead frame; and
a first semiconductive device disposed on the PWB and between the first angular deflection and a second angular deflection.

11. The system-in-package apparatus of claim 10, wherein each of the first angular deflection and the second angular deflection is a rectangular deflection.

12. The system-in-package apparatus of claim 10, the PWB spans the lead frame second planar section.

13. The system-in-package apparatus of claim 10, wherein the PWB twice spans the first angular deflection.

14. The system-in-package apparatus of claim 10, wherein the PWB includes at least one angular fold, wherein the angular fold spans a rectangular deflection.

15. The system-in-package apparatus of claim 10, wherein the first semiconductive device is in contact with the lead frame through a first thermal interface material, further including a subsequent device, and wherein the subsequent device is in contact with the lead frame through a subsequent thermal interface material.

16. The system-in-package apparatus of claim 10, where in the first semiconductive device is in contact with the lead frame through a first thermal interface material, further including:
- a subsequent device, and wherein the subsequent device is in contact the lead frame through a subsequent thermal interface material; and
- a second device disposed on the second planar section, wherein the second planar section is part of a second recess in the lead frame.

17. A computing system including a system-in-package apparatus comprising:
- an electrically inactive lead frame including a first recess therein and a feature;
- a printed wiring board (PWB) in contact with the lead frame, wherein the PWB spans the first recess, and wherein the PWB exhibits an angular fold in contact with the lead frame;
- a first semiconductive device disposed on the PWB and in the first recess;
- a subsequent device disposed on the PWB and in the feature; and
- wherein a portion of the PWB includes an external shell for the computing system.

18. The computing system of claim 17, wherein the first semiconductive device is in contact with the lead frame through a first thermal interface material, and wherein the subsequent device is in contact with the lead frame through a subsequent, thermal interface material.

19. The system-in-package of claim 17, wherein the first recess is defined by a first angular deflection, a first planar section in the first recess, and a second angular deflection.

20. The system-in-package of claim 17, wherein the first semiconductive device and subsequent semiconductive device are separated by the PWB angular fold.

* * * * *